(12) United States Patent
Furuhashi

(10) Patent No.: US 10,186,413 B2
(45) Date of Patent: Jan. 22, 2019

(54) TIME-OF-FLIGHT MASS SPECTROMETER

(71) Applicant: SHIMADZU CORPORATION, Kyoto-shi, Kyoto (JP)

(72) Inventor: Osamu Furuhashi, Uji (JP)

(73) Assignee: SHIMADZU CORPORATION, Kyoto-shi, Kyoto (JP)

( * ) Notice: Subject to any disclaimer, the term of this patent is extended or adjusted under 35 U.S.C. 154(b) by 29 days.

(21) Appl. No.: 15/539,229

(22) PCT Filed: Dec. 24, 2014

(86) PCT No.: PCT/JP2014/084033
§ 371 (c)(1),
(2) Date: Jun. 23, 2017

(87) PCT Pub. No.: WO2016/103339
PCT Pub. Date: Jun. 30, 2016

(65) Prior Publication Data
US 2017/0358440 A1    Dec. 14, 2017

(51) Int. Cl.
*H01J 49/40*    (2006.01)
*H01J 49/42*    (2006.01)
*H01J 37/26*    (2006.01)

(52) U.S. Cl.
CPC .......... *H01J 49/405* (2013.01); *H01J 37/266* (2013.01); *H01J 49/424* (2013.01)

(58) Field of Classification Search
CPC ....... H01J 49/405; H01J 49/424; H01J 37/266
(Continued)

(56) References Cited

U.S. PATENT DOCUMENTS 5,763,878 A    6/1998  Franzen
7,582,865 B2   9/2009  Schwartz et al.
(Continued)

FOREIGN PATENT DOCUMENTS

CA    2 651 776 A1    12/2007
CN    103380479 A     10/2013
(Continued)

OTHER PUBLICATIONS

Communication dated Apr. 4, 2018 from the State Intellectual Property Office of the P.R.C. in counterpart Application No. 201480084278.X.
(Continued)

*Primary Examiner* — Nicole Ippolito
(74) *Attorney, Agent, or Firm* — Sughrue Mion, PLLC

(57) ABSTRACT

An ion reflector has a configuration in which multiple plate electrodes having a rectangular opening are arranged. The components are arranged so that a central axial line extending in the longitudinal direction of the opening lies on a plane which contains a straight line (Y-axis) connecting the centroidal position of an ion distribution in an ion trap and a central position on the detection surface of a detector, and a central axial line (X-axis) of an ion-ejecting direction. If the potential distribution along the central axis of the ion reflector is modified so that a portion of the reflecting field becomes a non-uniform electric field intended for improving isochronism for a group of ions to be detected, an area having an ideal potential distribution for realizing the isochronism is spread in the Y-axis direction.

6 Claims, 6 Drawing Sheets

(58) Field of Classification Search
USPC .................. 250/281, 282, 283, 286, 287
See application file for complete search history.

(56) References Cited

U.S. PATENT DOCUMENTS

| | | | |
|---|---|---|---|
| 8,304,720 B2 | 11/2012 | Senko et al. | |
| 2005/0258364 A1* | 11/2005 | Whitehouse | H01J 49/062 250/292 |
| 2007/0176090 A1* | 8/2007 | Verentchikov | H01J 49/401 250/287 |
| 2008/0067360 A1 | 3/2008 | Senko et al. | |
| 2009/0272898 A1 | 11/2009 | Senko et al. | |
| 2013/0068942 A1* | 3/2013 | Verenchikov | H01J 49/4245 250/282 |
| 2014/0054456 A1* | 2/2014 | Kinugawa | H01J 49/405 250/287 |

FOREIGN PATENT DOCUMENTS

| | | |
|---|---|---|
| EP | 2 024 065 A2 | 2/2009 |
| EP | 2 669 930 A1 | 12/2013 |
| JP | 2009-540500 A | 11/2009 |
| JP | 2014-135248 A | 7/2014 |
| WO | 2007/145776 A2 | 12/2007 |
| WO | 2007/145776 A3 | 12/2007 |
| WO | 2012/086630 A1 | 6/2012 |
| WO | 2014/057777 A1 | 4/2014 |

OTHER PUBLICATIONS

International Search Report of PCT/JP2014/084033, dated Mar. 17, 2015. [PCT/ISA/210].
Written Opinion dated Mar. 17, 2015 in application No. PCT/JP2014/084033.

* cited by examiner

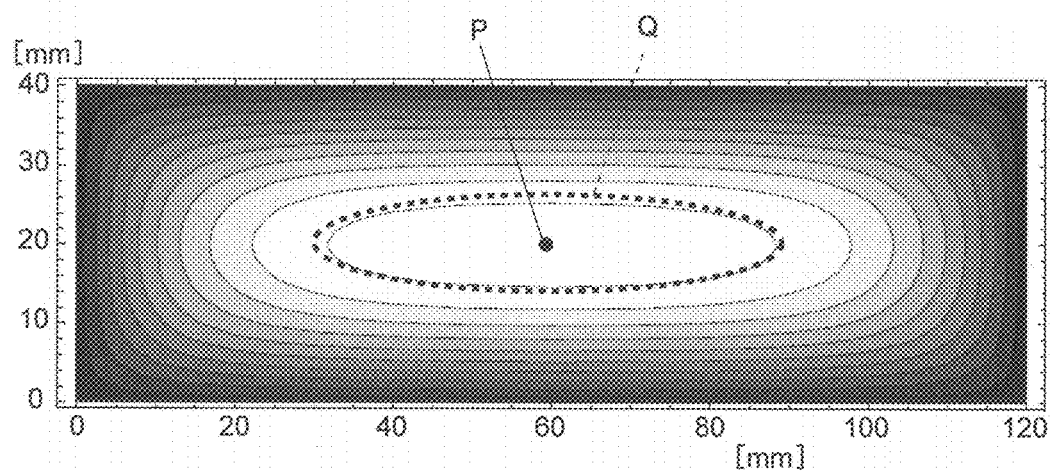

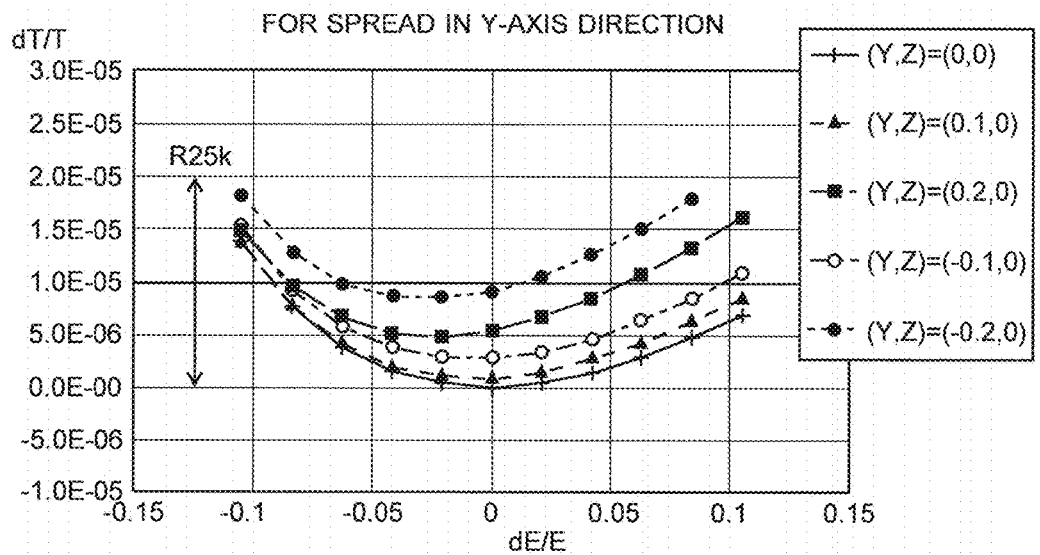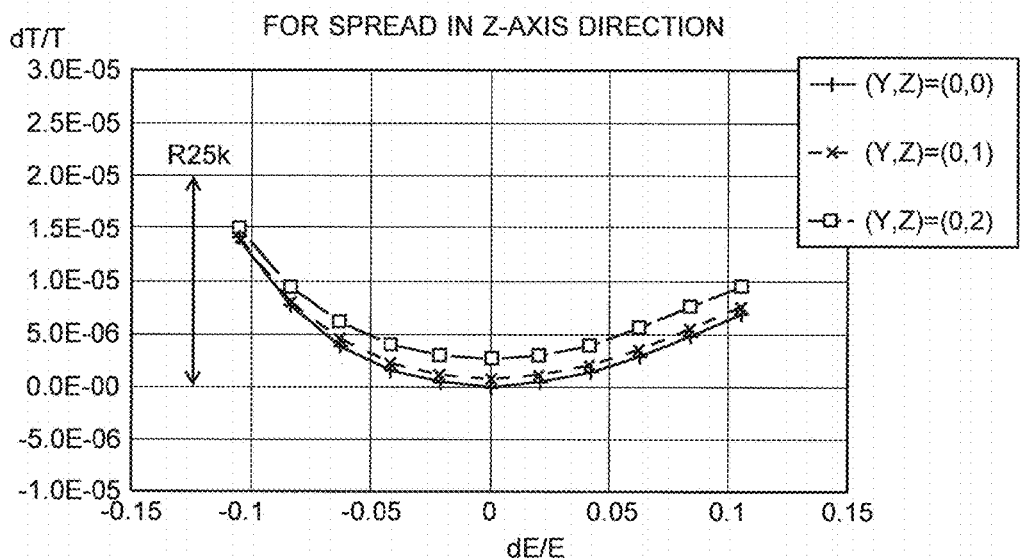

TIME-OF-FLIGHT MASS SPECTROMETER

CROSS REFERENCE TO RELATED APPLICATIONS

This application is a National Stage of International Application No. PCT/JP2014/084033 filed Dec. 24, 2014, the contents of all of which are incorporated herein by reference in their entirety.

TECHNICAL FIELD

The present invention relates to a time-of-flight mass spectrometer, and more specifically, to a time-of-flight mass spectrometer provided with a linear ion trap and a time-of-flight mass analyzer using an ion reflector.

BACKGROUND ART

In order to obtain information on the molecular structure of a compound in a sample, various mass spectrometric techniques have been commonly used, such as the $MS^2$ analysis in which an ion originating from the compound is selected as a precursor ion and subsequently dissociated by collision induced dissociation or a similar process, $MS^3$ analysis in which a specific ion is selected as another precursor ion from the ions (product ions) obtained by the dissociation and is subjected to mass spectrometry after being dissociated, as well as $MS^4$ or $MS^5$ analysis in which the cycle of selecting and dissociating the precursor ion is repeated. A commonly known type of mass spectrometer capable of an $MS^n$ analysis with n being an integer equal to or greater than three is a time-of-flight mass spectrometer in which an ion trap capable of holding ions within a space, selecting the held ions according to their mass-to-charge ratios (precursor-ion selection) and performing a dissociating operation on the selected ion, is combined with a time-of-flight mass analyzer which separates ions ejected from the ion trap according to their mass-to-charge ratios and detects the separated ions.

Ion traps which employ radiofrequency electric fields can be divided into two major types: a three-dimensional quadrupole ion trap composed of an annular ring electrode and a pair of endcap electrodes arranged so that the ring electrode is sandwiched between them, and a linear ion trap having a plurality of rod electrodes (whose number is normally an even number equal to or greater than four) arranged around a central axis. Compared to the three-dimensional quadrupole ion trap, the linear ion trap has a larger space to hold ions, which means that this device is less affected by space charges due to the ions and capable of holding a larger amount of ions. Accordingly, using a linear ion trap is effective for increasing the amount of ions to be subjected to mass spectrometry and improving the sensitivity of the analysis.

Time-of-flight mass analyzers can be divided into two major types: a linear type which makes ions only fly in one direction, and a reflection type (or reflectron type) which makes ions fly a round trip by means of an ion reflector. Compared to the linear type, the reflection type is more effective for improving the mass-resolving power since it allows for a longer flight distance without significantly increasing the size of the device. Another advantage is that the time-of-flight spread which occurs due to the spread (variation) in the initial energy of the ions can be compensated for when the flying ions are made to turn around. For those reasons, particularly in recent years, reflection time-of-flight mass analyzers have been popularly used in applications which require high mass-resolving power. In the following descriptions, a reflection time-of-flight mass analyzer which uses an ion reflector is simply called a time-of-flight mass analyzer, and a time-of-flight mass spectrometer which uses such a time-of-flight mass analyzer is simply called a time-of-flight mass spectrometer (TOFMS).

Currently, the most commonly used type of ion reflector is the dual-stage reflector. In the dual-stage reflector, the reflecting field is formed by two stages of uniform electric fields which have different potential gradients along an ion beam axis. A dual-stage reflector can normally compensate for the spread in the time of flight of the ions having the same mass-to-charge ratio to the second order differential of the initial energy, whereby high mass-resolving power is obtained.

It has been known that replacing at least a portion of the uniform electric fields with a non-uniform electric field having a non-linear potential distribution is profitable in order to further compensate for the spread of the time of flight to higher-order differential components of the initial energy and thereby improve the mass-resolving power. For example, in Patent Literature 1, 2 or other documents, the present inventor and associates have proposed a novel ion reflector based on a dual-stage reflector in which a non-uniform electric field is created by slightly modifying the potential distribution within the second-stage section on the farther side in the ion reflector. This ion reflector realizes an approximately ideal potential distribution on the flight path of a packet of ions having a higher amount of initial energy than a predetermined threshold and flying in the path on the central axis of the ion reflector, whereby almost perfect isochronism is achieved (i.e. a group of ions having the same mass-to-charge ratio yet being spread in the amount of initial energy are made to simultaneously arrive at the detector, so that the time-of-flight spread is eliminated).

CITATION LIST

Patent Literature

Patent Literature 1: WO 2012/086630 A
Patent Literature 2: WO 2014/057777 A
Patent Literature 3: JP 2014-135248 A
Patent Literature 4: U.S. Pat. No. 5,763,878 A

SUMMARY OF INVENTION

Technical Problem

Such an ion reflector which uses a non-uniform electric field at least within a portion of the reflecting field has the following problem which does not occur in the ion reflector which only uses uniform electric fields.

An ion reflector normally has a structure in which multiple plate electrodes each of which has a circular opening are arranged at predetermined intervals of space (see Patent Literature 3 or other documents), with predetermined DC voltages respectively applied to those plate electrodes so as to create a reflecting field for forcing ions to turn around within the inner space of the circular openings. If this reflecting field is a uniform electric field, all equipotential surfaces in the vicinity of the central axis become flat surfaces perpendicular to the central axis of the ion reflector, so that no potential difference occurs in the radial direction in an orthogonal plane to the central axis. By comparison, if the reflecting field is a non-uniform electric field, the equipotential surfaces are shaped like round bulges with their peaks located on the central axis of the ion reflector, so that a potential difference occurs in the radial direction in an orthogonal plane to the central axis. Therefore, even when the ideal potential distribution for realizing almost perfect isochronism is formed on the central axis of the ion reflector, the potential distribution for ions passing through positions which are radially separated from the central axis does not have an ideal form, which deteriorates the isochronism and lowers the mass-resolving power.

In this manner, the conventional ion reflector has a considerably limited space for the paths of the ions where a high degree of isochronism can be achieved.

As noted earlier, linear ion taps can hold a dramatically larger amount of ions than three-dimensional quadrupole ion traps. Therefore, in order to simultaneously realize both high analysis sensitivity and high mass-resolving power, it is preferable to combine a linear ion trap and a reflection time-of-flight mass analyzer using a non-uniform electric field. An ejection of the ions from the inner space of a linear ion trap into the flight space of a time-of-flight mass analyzer is normally performed in such a manner that the ions held in an elongated space extending along the central axis of the linear ion trap are ejected in a direction which is orthogonal to the central axis, as disclosed in Patent Literature 4. In such a case, the ions are distributed over a wide spatial range in the parallel direction to the central axis of the linear ion trap (for convenience, this direction is called the "Z-axis" direction) immediately before those ions are ejected. Accordingly, it is possible to infer that the ions maintain a comparatively large spatial spread in the Z-axis direction during their flight even after the ejection.

Accordingly, the present inventor has investigated flight trajectories of the ions ejected from a linear ion trap by computer simulation. The result confirmed that, from immediately after being ejected from the linear ion trap, the ions gradually and widely spread in the direction which is orthogonal to both the ejecting direction (for convenience, this direction is called the "X-axis" direction) and the Z-axis direction (for convenience, the third direction is called the "Y-axis" direction) during their travel. A possible reason for this spread is that, when the DC electric field for ejecting ions is created within the inner space of the rod electrodes forming the linear ion trap, the ions experience forces in different directions having a certain angular range in the X-Y plane with respect to the X axis, since the inner surfaces of those rod electrodes are curved. Since the field-free drift region located before the ion reflector in the time-of-flight mass analyzer normally has a considerable length, the ions which gradually spread in the Y-axis direction during their travel have a considerably larger spread in that direction than in the Z-axis direction by the time they enter the ion reflector. As a result, a considerable percentage of the ions pass through positions which are significantly distant from the central axis of the ion reflector, which means that the non-uniform electric field intended for improving the isochronism cannot be satisfactorily utilized and the isochronism is deteriorated.

The present invention has been developed to solve the previously described problem. Its objective is to achieve, in a time-of-flight mass spectrometer using a linear ion trap as an ion ejection source, a high level of mass-resolving power by improving the isochronism of ions while making use of the high level of analysis sensitivity obtained by subjecting a larger amount of ions than in a three-dimensional quadrupole ion trap.

Solution to Problem

The present invention developed for solving the previously described problem is a time-of-flight mass spectrometer provided with: a linear ion trap including a plurality of rod electrodes arranged around a central axis, for trapping ions within a space surrounded by the plurality of rod electrodes: a time-of-flight mass analyzer having a field-free region in which ions are made to fly and an ion reflector which reflects ions; and a detector for detecting ions, the time-of-flight mass spectrometer configured to eject ions captured within the inner space of the ion trap into the time-of-flight mass analyzer in a direction orthogonal to the central axis of the ion trap, separate the ions according to their mass-to-charge ratios by the time-of-flight mass analyzer, and introduce the separated ions into the detector to detect the ions, the time-of-flight mass spectrometer being characterized in that:

the ion reflector has a configuration in which a plurality of plate electrodes each of which has a rectangular or slit-like opening are arranged along an axis orthogonal to a planer surface of each plate electrode; and the ion trap, the ion reflector and the detector are arranged so that a center line of the opening of each plate electrode extending along the longitudinal direction of the same opening is contained in a plane which contains: a straight line connecting a centroidal position of an ion distribution in the ion-capturing space of the ion trap and a predetermined position on the detection surface of the detector, and a central axial line of a direction for ejecting ions present at the centroidal position of the ion distribution.

The "rectangular" opening is an opening in which the two short sides facing each other are formed by edge portions of the plate electrode, whereas the "slit-like" opening is an opening in which the two short sides facing each other are open (although this opening can theoretically be infinite in length, it should practically have a finite length).

Consider the case where a non-uniform electric field whose potential distribution on the central axis of the ion reflector exhibits a non-linear form is used at least within a portion of the ion reflector in order to realize a high level of isochronism by means of the ion reflector. This condition is necessary since, as already explained, no potential difference occurs in an orthogonal plane to the central axis of the ion reflector if the entire reflecting field in the ion reflector is a uniform electric field.

For an ion reflector constructed by arranging plate electrodes each of which has a rectangular or slit-like opening, the present inventor has performed a computer simulation to determine the potential distribution on an orthogonal plane to the central axis of the ion reflector under the condition that the reflecting field is a non-uniform electric field. The result demonstrated that the equipotential area on the plane of the rectangular opening is elongated in the longitudinal direction of the opening. This means that, when an ideal potential distribution which can achieve perfect isochronism is formed on the central axis of the ion reflector, the resulting potential distribution has an ideal form within a wide space which extends along the long sides of the opening, surrounding the central axis.

An ion ejected from the linear ion trap follows a flight path which turns around within the ion reflector and leads to the detection surface of the detector placed at a certain distance from the ion trap. Accordingly, the extending direction of the straight line connecting the point of ejection of the ion and the point of arrival on the detection surface coincides with the direction in which the ion moves the largest distance as observed on the orthogonal plane to the ejecting direction of the ion. In the time-of-flight mass spectrometer according to the present invention, the longitudinal direction of the rectangular openings or slit-like openings of the plate electrodes forming the ion reflector is aligned with this direction in which the ion moves the largest distance. Furthermore, when arriving at the ion reflector, the ion reaches an area near the center line of the opening of the first plate electrode extending along the longitudinal direction of the same opening. Accordingly, the turn-around path of the ion flying in the reflecting field of the ion reflector is likely to be included in the aforementioned area having the ideal form of potential distribution which is spread along the long sides of the openings of the plate electrodes.

The direction in which ions are ejected from the linear ion trap is an orthogonal direction to the central axis of the ion trap. The equipotential surfaces of the DC electric field created for the ejection within the inner space of the ion trap take the form of curved surfaces extending along the inner circumferential surfaces of the rod electrodes. Therefore, during their travel, the ejected ions gradually spread in the direction which is orthogonal to both the ejecting direction and the central axis of the ion trap. This spatial spread of the ions will eventually be far larger than their spread in the direction of the central axis of the ion trap. In the time-of-flight mass spectrometer according to the present invention, the longitudinal direction of the rectangular openings or slit-like openings of the plate electrodes forming the ion reflector is aligned with this direction in which the ions will be considerably spread. Accordingly, even when the ions are spatially spread due to the previously described factors, the turn-around paths of those spread ions flying in the reflecting field of the ion reflector are likely to be included in the area having the ideal form of potential distribution which is spread along the long sides of the openings of the plate electrodes.

In this manner, in the time-of-flight mass spectrometer according to the present invention, a large amount of ions ejected from the linear ion trap are made to fly in the area in the ion reflector where the ideal potential distribution is formed, and eventually arrive at the detector. Consequently, a mass spectrometric analysis can be performed for a large amount of ions with a high degree of isochronism, so that a high level of mass-resolving power can be achieved.

For the previously explained reason, in the time-of-flight mass spectrometer according to the present invention, at least a portion of the potential distribution on the central axis of the ion reflector should preferably have a non-linear form.

In the time-of-flight mass spectrometer according to the present invention, the "predetermined position on the detection surface of the detector" is typically the central point of the detector surface, but does not need to exactly coincide with at the central point. The "center line of the opening of each plate electrode extending along the longitudinal direction of the same opening" should preferably, but does not need to exactly, lie on the plane which contains: the straight line connecting the centroidal position of the ion distribution and the predetermined position on the detection surface of the detector, and the central axial line of the direction for ejecting ions present at the centroidal position of the ion distribution. In other words, the minimum requirement is as follows: in view of the fact that the ions which gradually spread during their travel after being ejected from the ion trap follow their respective different paths, the arrangement of the ion trap, ion reflector and detector should be determined so that most of those ions which will eventually arrive at the detector after flying in such different paths will fly in the area in the ion reflector where the ideal potential distribution is formed.

Advantageous Effects of the Invention

The time-of-flight mass spectrometer according to the present invention can achieve a high level of analysis sensitivity by subjecting a large amount of ions originating from a sample component to mass spectrometry, while realizing a high level of mass-resolving power by improving the isochronism of that large amount of ions.

BRIEF DESCRIPTION OF DRAWINGS

FIG. 6 is a graphical image showing the result of a computer simulation of the potential distribution on the opening plane of the ion reflector.

FIGS. 7A and 7B are graphs showing the result of a simulation of the relative time-of-flight spread dT/T of the ions with respect to their relative energy spread dE/E in the configuration shown in FIG. 5.

DESCRIPTION OF EMBODIMENTS

Hereinafter, a time-of-flight mass spectrometer (which is hereinafter abbreviated as the "TOFMS") as one embodiment of the present invention is described with reference to the attached drawings.

Figure 1:
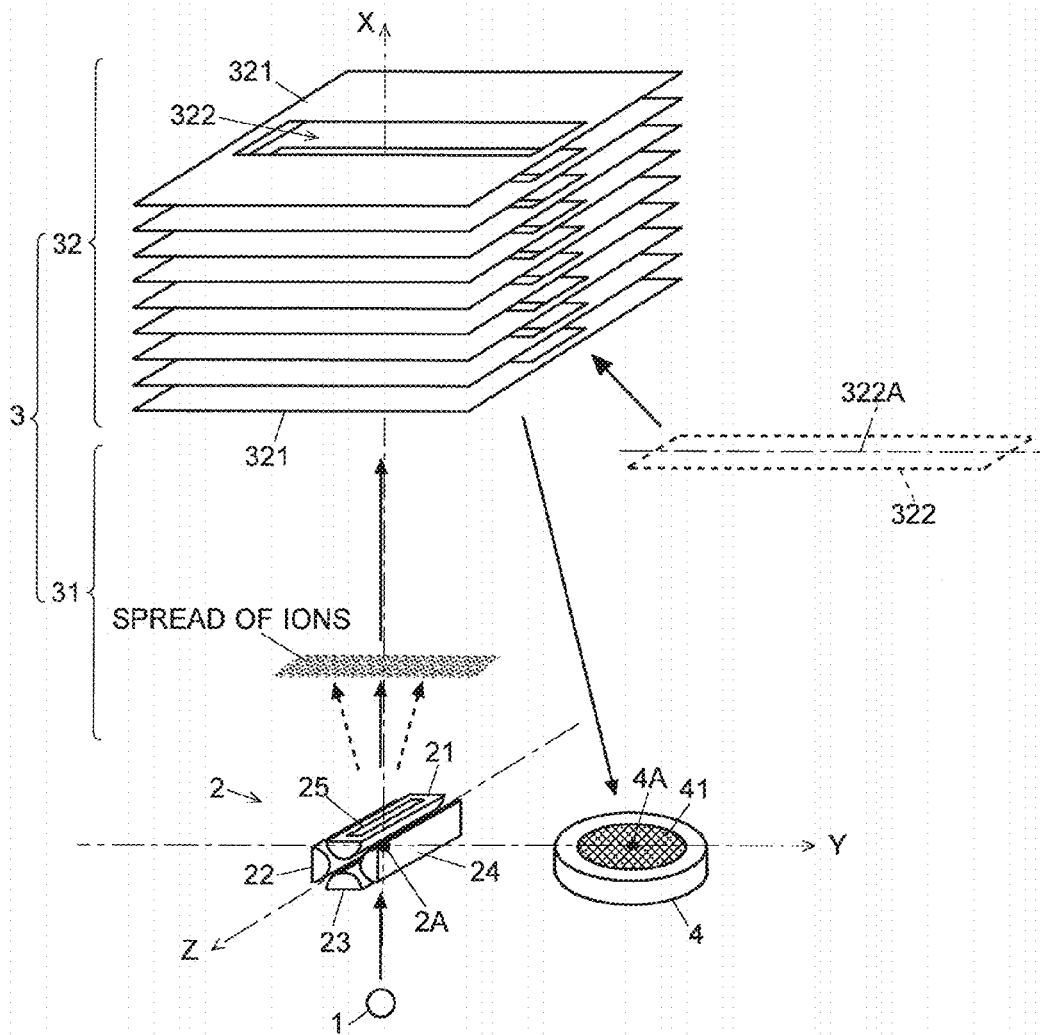
FIG. 1 is a schematic configuration diagram of a time-of-flight mass spectrometer according to one embodiment of the present invention.
Figure 2:
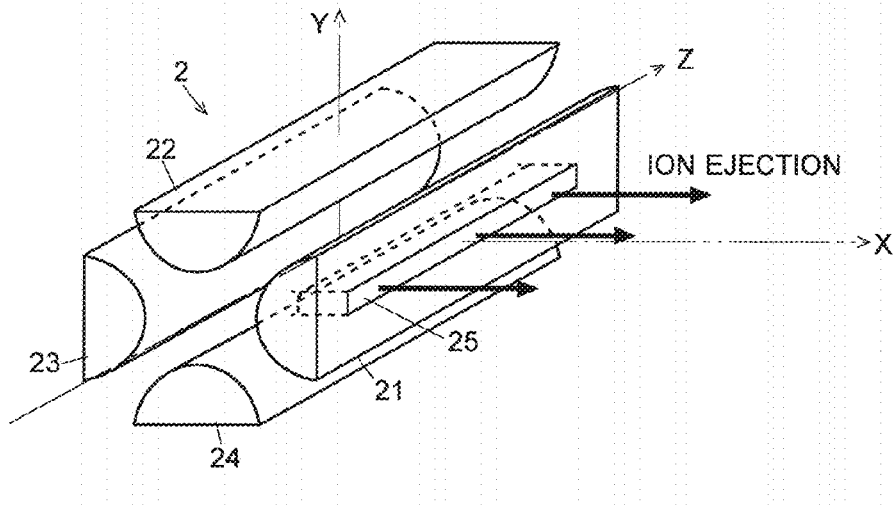
FIG. 2 is a schematic perspective view of the linear ion trap in the time-of-flight mass spectrometer of the present embodiment.
Figure 3:
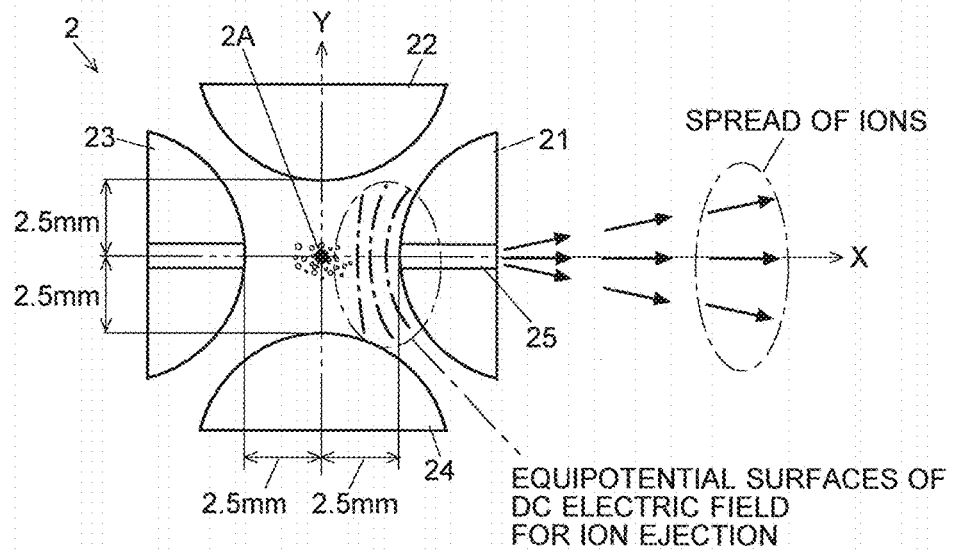
FIG. 3 is a sectional view at an X-Y plane of the linear ion trap shown in FIG. 2.

FIG. 1 is a schematic configuration diagram of the TOFMS of the present embodiment. FIG. 2 is a schematic perspective view of the linear ion trap in the TOFMS of the present embodiment. FIG. 3 is a sectional view at an X-Y plane of the same linear ion trap.

The TOFMS of the present embodiment has an ion source 1 for generating ions originating from a compound, a linear ion trap 2 for capturing ions by the effect of a radiofrequency electric field, a reflection time-of-flight mass analyzer 3 for separating ions according to their mass-to-charge ratios, and a detector 4 for detecting ions. For convenience, the three axes of X, Y and Z which are orthogonal to each other are defined, as shown in the drawings, within the three-dimensional space in which those components are arranged.

The ion source 1 may employ any ionization technique as long as it can ionize a compound in a sample. For example, if the sample is a liquid sample, such ionization methods as the electrospray ionization or atmospheric pressure chemical ionization can be used. If the sample is a gas sample, such ionization methods as the electron ionization or chemical ionization can be used.

The linear ion trap 2, as shown in FIGS. 2 and 3, is composed of four rod electrodes 21, 22, 23 and 24 arranged so as to surround a central axis which extends in the Z-axis direction. Those rod electrode 21-24 have a circular (ideally, hyperbolic) cross section on their surfaces facing the central axis. In one rod electrode 21, an elongated ion ejection opening 25 extending in the Z-axis direction is formed to allow for the ejection of ions from the ion-capturing space surrounded by the rod electrodes 21-24 to the outside. An ion injection opening for introducing ions generated by the ion source 1 into the ion-capturing space may additionally be formed in one of the other rod electrodes 22-24. Alternatively, ions may be introduced from both extreme ends into the ion-capturing space.

Though not shown, a radio-frequency voltage for capturing ions and a DC voltage for ejecting ions through the ion ejection opening 25 are applied from a power source to each of the four rod electrodes 21-24. Additionally, in the case where the selection of a precursor ion and dissociation of the selected precursor ion (e.g. collision induced dissociation) is performed in the linear ion trap 2, the voltages for performing those operations can also be selectively applied to the four rod electrodes 21-24.

The time-of-flight mass analyzer 3 includes a field-free drift region 31 and an ion reflector 32. Though not described in this embodiment, these sections are normally placed within a drift tube. Unlike conventionally and commonly known ion reflectors in which plate electrodes having a circular opening are arranged in layers, the ion reflector 32 includes a plurality of plate electrodes 321 having a rectangular opening 322 arranged at predetermined intervals of space along an axial line which is orthogonal to the planer surfaces of those electrodes 321 (FIG. 1 shows nine electrodes, although a greater number of electrodes are normally used).

Though not shown, a different DC voltage is applied from a power source to each of the plate electrodes 321 in order to create a reflecting field within the rectangular-parallelepiped open space 322 formed by arranged the rectangular openings 322 of the plate electrodes 321 in layers.

The detector 4 is, for example, a detector using a microchannel plate or secondary electron multiplier. It has a large detection surface 41 for efficiently detecting ions which are spatially spread to a certain extent.

In addition to the previously described configuration of the ion reflector 32, the TOFMS is characterized by the arrangement of the linear ion trap 2, ion reflector 32 and detector 4.

In the linear ion trap 2, the elongated space extending in the Z-axis direction surrounded by the four rod electrodes 21-24 forms the ion-capturing space. In normal situations, the centroidal position 2A of the ion distribution in the ion-capturing space is located on the central axis as well as at the center of the spread of the ions in the Z-axis direction. The arrangement of the aforementioned components is determined so that the central axial line 322A extending in the longitudinal direction of the rectangular openings 322 of the plate electrodes 321 lies on the plane which contains both the straight line which connects the centroidal position 2A of the ion distribution and a central position 4A of the detection surface 41 of the detector 4 (in the example of FIG. 1, this line coincides with the Y-axis), and the central axial line of the direction for ejecting the ions present at the centroidal position 2A of the ion distribution in the linear ion trap 2 (in the example of FIG. 1, this central axial line coincides with the X-axis).

The operation and effect of the previously described arrangement in the TOFMS of the present embodiment is hereinafter described, including descriptions of computer simulations performed by the present inventor.

Figure 5:
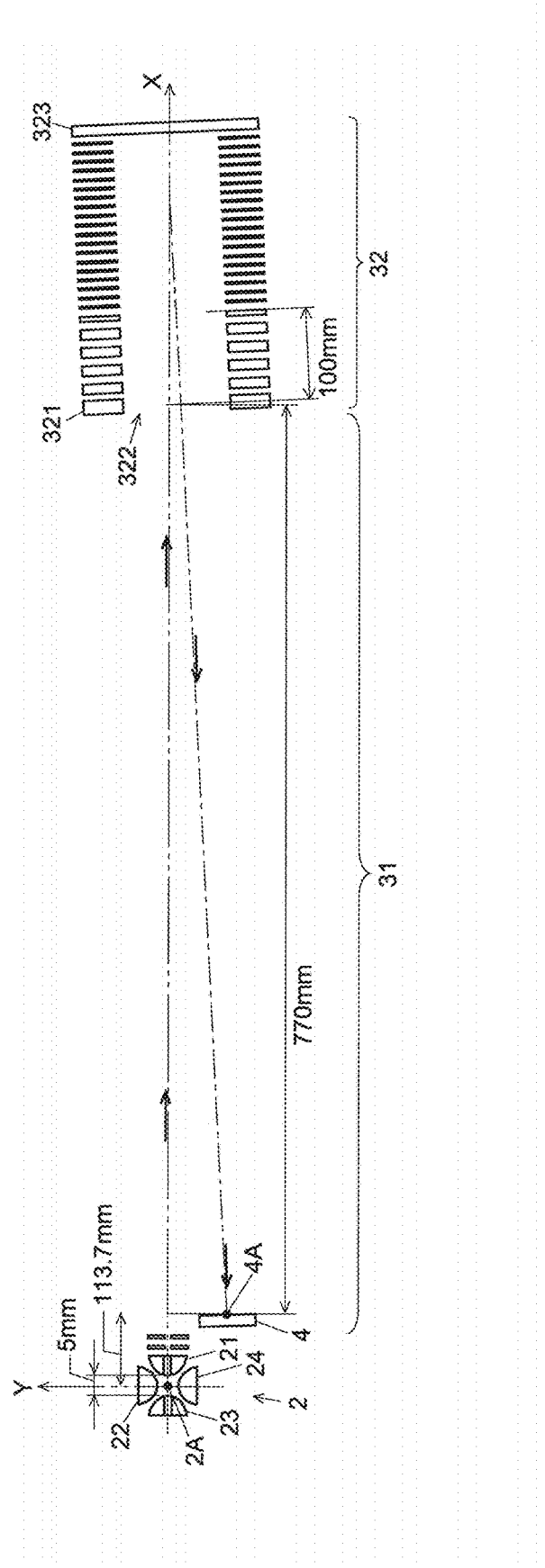
FIG. 5 is a configuration diagram showing an assumed model used in a computer simulation in the time-of-flight mass spectrometer of the present embodiment.

FIG. 5 is a configuration diagram showing the assumed model used in the computer simulation in the TOFMS of the present embodiment. In this model, the detector 4 is located on the X-Y plane, although not on the Y-axis. Accordingly, the straight line connecting the centroidal position 2A in the linear ion trap 2 and the central position 4A on the detector 4 is also located on the X-Y plane. The ion reflector 32 is arranged so that the central axial line 322A of the rectangular opening 322 of each plate electrode 321 lies on this X-Y plane.

As shown in FIG. 5, the distance between the rod electrodes 21 and 23 as well as 22 and 24 facing each other in the linear ion trap 2 is 5 mm. The distance from the central axis (i.e. Z-axis) to the inner surface of each rod electrode 21-24 is 2.5 mm.

The ion reflector 32 is a dual-stage reflector divided into the first-stage section and second-stage section. Though not shown, a grid electrode consisting of parallel wires having a diameter of 20 μm and grid interval of 250 μm is located on each of the front and rear sides of the 100-mm long first-stage section. Those grid electrodes form the boundary surface between the field-free drift region 31 and the first-stage section as well as the boundary surface between the first-stage and second-stage sections. Using the technique disclosed in Patent Literature 1, the DC voltages applied to the plate electrodes 321 are set so that the electric field within the area farther than the second time-focal point for the ions within the second-stage section becomes a non-uniform electric field whose potential gradient gradually increases toward the farther side, instead of a uniform electric field. This technique improves the isochronism of ions having a large amount of energy spread. The potential distribution on the central axis of the ion reflector 32 is an ideal potential distribution produced by the non-uniform electric field which ensures perfect isochronism for a group of ions reflected on the central axis. It should be noted that the first-stage and second-stage sections have different thicknesses of the plate electrodes, using the technique disclosed in Patent Literature 2.

For an ion reflector having an axially-symmetrical potential distribution, i.e. for a conventional ion reflector composed of plate electrodes having a circular opening, it has been commonly known that the potential distribution U(r, x) within the inner space of the ion reflector is given by the following equation (1):

$$U(r,x)=\varphi_0(x)-(1/4)\cdot r^2\cdot\varphi_0''(x) \quad (1)$$

where x and r respectively represent the coordinate on the axis of symmetry of the ion reflector and the coordinate in the radial direction. The term $\varphi_0(x)$ is the potential distribution on the central axis, while $\varphi_0''(x)$ is the secondary differentiation of $\varphi_0(x)$. If the potential distribution on the central axis has a linear form due to a uniform electric field, $\varphi_0''(x)$ constantly has a value of zero, in which case all equipotential surfaces become orthogonal to the central axis and there is no difference in the potential distribution in the radial direction. By comparison, as in the TOFMS of the present embodiment, if the electric field is modified so as to improve the isochronism, the potential distribution on the central axis has a slightly curved form. In that case, the equipotential surfaces shaped like round bulges with their centers located on the central axis. Therefore, the potential distribution in an orthogonal plane to the central axis has a slope in the radial direction.

As in the present embodiment, if the opening of the plate electrode 321 has a rectangular shape, the formula which gives the potential distribution within the ion reflector 32 will be a complex function depending on two variables, i.e. the coordinate in the longitudinal direction of the opening and the coordinate in the lateral direction. However, if the potential distribution on the central axis has a curved shape intended for improving the isochronism as in the conventional device having a circular opening, a slope is formed in the potential distribution in an orthogonal plane to the central axis within the inner space of the plate electrodes. FIG. 6 shows the result of a computer simulation of the potential distribution on the opening plane of a rectangular opening 322 having an opening size of 40×120 mm. In FIG. 6, the potential level is represented by grayscale, with brighter areas indicating higher potentials.

Figure 4:
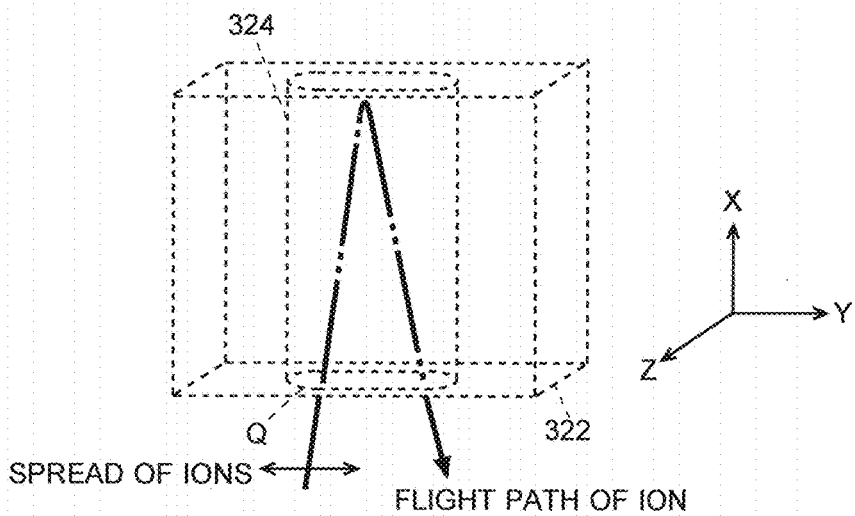
FIG. 4 is a schematic diagram showing one example of the flight path of an ion flying within the ion reflector in the time-of-flight mass spectrometer of the present embodiment.

As can be seen in FIG. 6, an elongated area where the potential is substantially at the same level is formed along the direction of the long sides (the sides which extend horizontally in FIG. 6) of the rectangular opening. This means that, if an ideal potential distribution is formed at point P having the coordinates of (60, 20) on the central axis of the ion reflector, the ideal potential is also formed within the surrounding area Q. Thus, by giving the opening a rectangular shape, the area where the ideal potential is formed can be expanded in the longitudinal direction of the opening. The same holds true for an opening having a slit-like shape with its short sides open. Accordingly, a substantially elliptical-columnar area 324 as shown in FIG. 4 serves as the area having an ideal potential distribution within the substantially rectangular-parallelepiped inner space formed by the rectangular openings 322 of the plate electrodes 321 of the ion reflector 32.

As described earlier, in the TOFMS of the present embodiment, the central axial line 322A which extends in the longitudinal direction of the rectangular opening 322 of the plate electrode 321 lies on the plane which contains both the straight line connecting the centroidal position 2A of the ion distribution and the central position 4A of the detection surface 41 of the detector 4, and the central axial line of the direction for ejecting the ions present at the centroidal position 2A of the ion distribution. An ion ejected from the centroidal position 2A follows a substantially U or V-shaped flight path which turns around within the ion reflector 32 and leads to the detection surface 41 of the detector 4. This flight path lies on the plane which contains both the straight line connecting the centroidal position 2A and the central position 4A, and the central axial line of the direction for ejecting the ion. In other words, this flight path lies on the X-Y plane. Meanwhile, the aforementioned substantially elliptical-columnar area 324 having the ideal potential distribution is spread in the Y-axis direction. Therefore, as shown in FIG. 4, the flight path of the ion within the ion reflector 32 is included in the substantially elliptical-columnar area 324. Since the entire flight path of the ion during the turn-around flight is thus assuredly included in the substantially elliptical-columnar area 324 having the ideal potential distribution, it is easy to ensure isochronism of the ion. This is one of the effects obtained by adopting the previously described characteristic configuration in the TOFMS of the present embodiment.

According to the simulation calculation by the present inventor, ions ejected from the capturing space in the linear ion trap 2 through the ion ejection opening 25 become considerably spread in the orthogonal direction to the central axis of the ion trap 2 (in the present case, Z-axis), or in the Y-axis, during their travel, as shown in FIG. 3. The cause of this spread is as follows: When the ions are ejected, predetermined DC voltages are respectively applied to the rod electrodes 21 and 23 facing each other across the central axis of the ion trap 2. Since the inner surfaces of the rod electrodes 21-24 have a substantially cylindrical shape as shown in FIG. 3, the DC electric field created between the ion ejection opening 25 and the central axis has curved equipotential surfaces. Ions placed within such a DC electric field experience forces in different directions having a certain angular range in the X-Y plane with respect to the X-axis. Accordingly, the spread of the ions inevitably occurs when the ions are ejected from the linear ion trap 2 having the previously described configuration in a direction which is orthogonal to the central axis of the ion trap.

Although the ions are spread in the Z-axis direction when held within the linear ion trap 2, the spread of the ions in the Z-axis direction will not significantly increase upon ejection of those ions from the ion trap 2. Therefore, although the spread of the ions in the Z-axis direction is larger than in the Y-axis direction at the point of ejection from the linear ion trap 2, the spread of the ions in the Y-axis direction gradually increases during their flight through the field-free drift region 31. By the time the ions reach the ion reflector 32, the spread of the ions in the Y-axis direction becomes far larger than their spread in the Z-axis direction.

In the TOFMS of the present embodiment, the spread direction of the substantially elliptical-columnar area 324 having the ideal potential distribution as described earlier is aligned with the Y-axis direction, i.e. the direction in which the ions will be considerably spread. Therefore, even if the ions are spread due to the variation in the direction in which those ions are ejected, the flight paths of those spread ions will be included within the substantially elliptical-columnar area 324 to the largest possible extent.

To confirm the effect of the previously described spread of the ions in the Y-axis direction, a simulation calculation has been performed for the configuration shown in FIG. 5, in which the change in the period of time required for an ion to fly to the detector 4 was calculated with respect to a change in the initial position of the ion within the linear ion trap 2. FIG. 7A shows the relationship between the energy spread (dE/E) of the ions and their time-of-flight difference (dT/T) for various amounts of shift in the initial position of the ions in the Y-axis direction. FIG. 7B shows the relationship between the energy spread of the ions (dE/E) and their time-of-flight difference (dT/T) for various amounts of shift the initial position of the ions in the Z-axis direction. The energy spread (dE/E) corresponds to the variation in the initial position of the ions from 0.5 mm to +0.5 mm in the X-axis direction, which leads to an energy spread of 7000 eV±700 eV ($\Delta E/E = \pm 10\%$) within the field-free drift region 31. Additionally, for example, (Y, Z)=(0, 0) in FIG. 7A indicates that the initial position was shifted in neither the Z-axis nor Y-axis direction, i.e. that the initial position was located at the centroidal position 2A while (Y, Z)=(0.1, 0) indicates that the initial position was shifted by +0.1 mm in the Y-axis direction.

FIGS. 7A and 7B demonstrate that the time-of-flight spread (dT/T) will be less than 2E-5 ($=2 \times 10^{-5}$) even when the energy spread is ±10%. In terms of the mass-resolving power, this time-of-flight spread corresponds to a high resolving power: R=T/2dT=25000. A comparison of FIGS. 7A and 7B demonstrates that a shift in the initial position of the ions in the Y-axis direction causes a comparatively greater change in the time of flight than a shift in the Z-axis direction. This is the effect of the previously described spread of the ions which occurs when ions are ejected from the linear ion trap 2. A change in the initial position of the ions causes a shift in the flight paths of those ions leading to the detector 4. This shift in the flight paths may possibly deteriorate the degree of isochronism and increase the time-of-flight spread. However, FIGS. 7A and 7B demonstrate that, even under the effect of the spread of the ions in the Y-axis direction, the time-of-flight spread is not considerably increased, i.e. a high degree of isochronism is achieved.

Figure 8A:
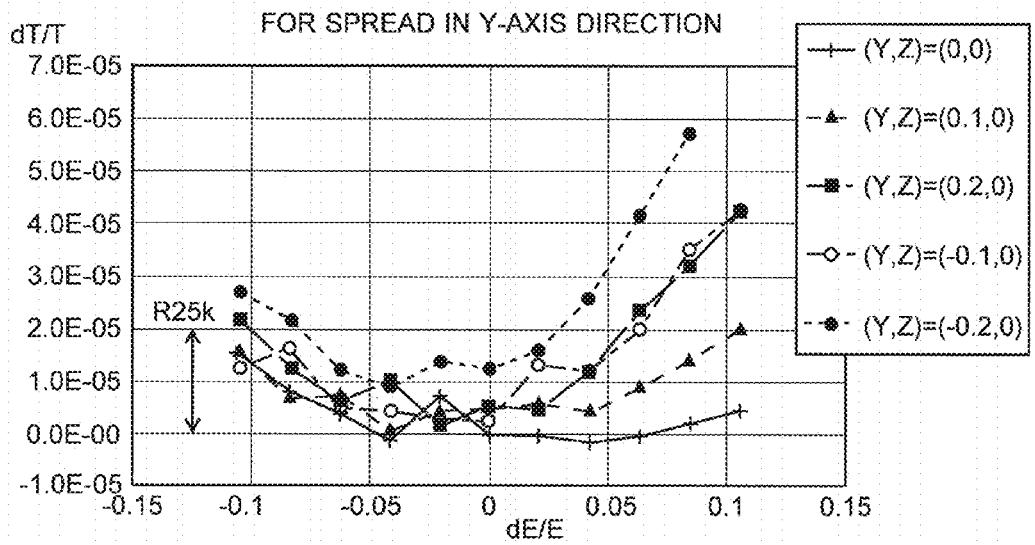
FIGS. 8A and 8B are graphs showing the result of a simulation of the relative time-of-flight spread dT/T of the ions with respect to their relative energy spread dE/E in the case where a conventional ion reflector having a circular opening was used.
Figure 8B:
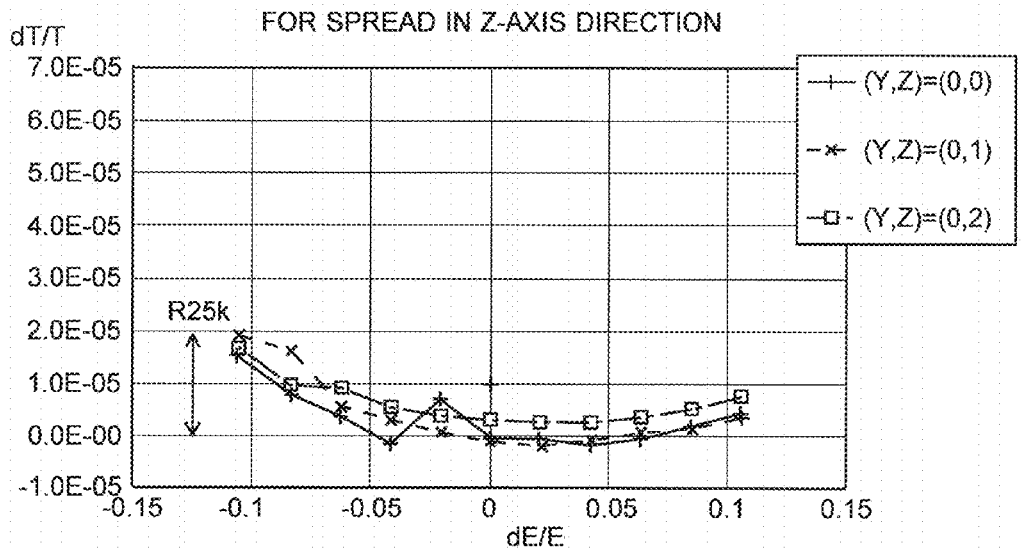

For comparison with the TOFMS of the present embodiment, the simulation for investigating the relative time-of-flight spread dT/T with respect to the relative energy spread dE/E was also performed for a conventional ion reflector having the configuration shown in FIG. 5 yet with a circular opening (having a diameter of 50 mm). The result is shown in FIGS. 8A and 8B. As can be seen in FIG. 8B, a shift in the initial position of the ions in the Z-axis direction causes almost no performance deterioration. By comparison, as shown in FIG. 8A, a shift in the initial position of the ions in the Y-axis direction considerably lowers the degree of allowance for energy spread, causing the time-of-flight spread to noticeably increase for an energy spread. A possible reason for this result is that a shift in the initial position of the ions in the Y-axis direction from the centroidal position 2A is accompanied by a shift in the flight paths of the ions, which causes the ions to pass through an area where the ideal potential distribution is not present.

Those simulation results also confirm that the TOFMS of the present embodiment can realize a high degree of isochronism for ions and thereby achieve a high level of mass-resolving power even if those ions are spread due to the variation in the direction in which those ions are ejected.

It should be noted that the previous embodiment is a mere example of the present invention, and any change, modification or addition appropriately made within the spirit of the present invention will naturally fall within the scope of claims of the present application.

For example, in the TOFMS of the previous embodiment, ions are ejected through the ion ejection opening formed in one rod electrode in the linear ion trap. This configuration can be modified, for example, as in the device described in Patent Literature 4 in which ions are ejected through the gap between two rod electrodes which circumferentially neighbor each other. The linear ion trap does not always need to be composed of four rod electrodes but may have any even number of rod electrodes equal to or greater than four.

REFERENCE SIGNS LIST

1 . . . Ion Source
2 . . . Linear Ion Trap
21-24 . . . Rod Electrode
20 25 . . . Ion Ejection Opening
2A . . . Centroidal Position of Ion Distribution
3 . . . Time-of-Flight Mass Analyzer
31 . . . Field-Free Drift Region
32 . . . Ion Reflector
321 . . . Plate Electrode
322 . . . Rectangular Opening
322A . . . Central Axial Line of Opening
324 . . . Substantially Elliptical-Columnar Area
4 . . . Detector
41 . . . Detection Surface
4A . . . Central Position of Detection Surface

The invention claimed is:

1. A time-of-flight mass spectrometer provided with: a linear ion trap including a plurality of rod electrodes arranged around a central axis, for trapping ions within a space surrounded by the plurality of rod electrodes; a time-of-flight mass analyzer having a field-free region in which ions are made to fly and an ion reflector which reflects ions; and a detector for detecting ions, the time-of-flight mass spectrometer configured to eject ions captured within the inner space of the ion trap into the time-of-flight mass analyzer in a direction orthogonal to the central axis of the ion trap, separate the ions according to their mass-to-charge ratios by the time-of-flight mass analyzer, and introduce the separated ions into the detector to detect the ions, wherein:

the ion reflector has a configuration in which a plurality of plate electrodes each of which has a rectangular or slit-like opening are arranged along an axis orthogonal to a planer surface of each plate electrode; and the ion trap, the ion reflector and the detector are arranged so that a center line of the opening of each plate electrode extending along a longitudinal direction of the same opening is contained in a plane which contains: a straight line connecting a centroidal position of an ion distribution in the ion-capturing space of the ion trap and a predetermined position on a detection surface of the detector, and a central axial line of a direction for ejecting ions present at the centroidal position of the ion distribution.

2. The time-of-flight mass spectrometer according to claim 1, wherein:

at least a portion of the potential distribution on the central axis of the ion reflector has a non-linear form.

3. The time-of-flight mass spectrometer according to claim 1, wherein:

the ion trap and the ion reflector are arranged so that a center line of the longitudinal direction of the openings of the plate electrodes in the ion reflector is contained in a plane which is orthogonal to an extending direction of the central axis of the ion trap and contains the central axial line of the direction for ejecting ions from the ion trap.

4. The time-of-flight mass spectrometer according to claim 3, wherein:

at least a portion of the potential distribution on the central axis of the ion reflector has a non-linear form.

5. The time-of-flight mass spectrometer according to claim 1, wherein:

the ion trap and the ion reflector are arranged so that a direction which is orthogonal to both an extending direction of the central axis of the ion trap and an extending direction of the central axial line of the direction for ejecting ions from the ion trap coincides with the longitudinal direction of the openings of the plate electrodes in the ion reflector.

6. The time-of-flight mass spectrometer according to claim 5, wherein:

at least a portion of the potential distribution on the central axis of the ion reflector has a non-linear form.

* * * * *